(12) United States Patent
Aoyama

(10) Patent No.: US 8,036,318 B2
(45) Date of Patent: Oct. 11, 2011

(54) CLOCK AND DATA RECOVERY CIRCUIT

(75) Inventor: Morishige Aoyama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 803 days.

(21) Appl. No.: 12/078,934

(22) Filed: Apr. 8, 2008

(65) Prior Publication Data

US 2008/0253493 A1 Oct. 16, 2008

(30) Foreign Application Priority Data

Apr. 13, 2007 (JP) ................. 2007-105958

(51) Int. Cl.
 *H04L 27/00* (2006.01)
(52) U.S. Cl. ........ 375/326; 375/294; 375/327; 375/371; 375/375; 375/376; 327/157; 331/11; 331/16; 331/17
(58) Field of Classification Search ............... 375/215, 375/294, 326, 327, 344, 345, 349, 350, 362, 375/371, 373, 375, 376, 297, 359
See application file for complete search history.

(56) References Cited

U.S. PATENT DOCUMENTS

| 5,590,157 | A  | * | 12/1996 | Schuur ........................ 375/327 |
| 7,362,185 | B1 | * | 4/2008  | Yildiz et al. ..................... 331/17 |
| 7,737,792 | B2 | * | 6/2010  | Kawamoto et al. ............. 331/10 |
| 7,746,971 | B2 | * | 6/2010  | Masui et al. ................... 375/355 |
| 2004/0252804 | A1 | * | 12/2004 | Aoyama ........................ 375/376 |
| 2006/0056564 | A1 | * | 3/2006  | Takeuchi ....................... 375/376 |
| 2007/0018745 | A1 | * | 1/2007  | Knotts et al. .................. 331/179 |

FOREIGN PATENT DOCUMENTS

JP 2005-5999 1/2005

* cited by examiner

*Primary Examiner* — Shuwang Liu
*Assistant Examiner* — Hirdepal Singh
(74) *Attorney, Agent, or Firm* — McGinn IP Law Group, PLLC

(57) ABSTRACT

The phase detector compares the phases of a synchronous clock signal and serial data and outputs a phase error signal corresponding to a comparison result. The second integrator performs integration of the phase error signal to obtain a phase correction control signal for tracking phase shift of the serial data. The first integrator performs integration of the phase error signal in each smoothing period with a predetermined length to obtain a smoothed error signal. The pattern generator generates a pattern for changing the phase of the synchronous clock signal at a frequency corresponding to the smoothed error signal in each pattern generation period with a predetermined length and outputs the pattern as a frequency correction control signal. The first integrator receives the frequency correction control signal which is fed back and changes the length of the smoothing period according to the direction of a change in the frequency of generating the frequency correction control signal.

19 Claims, 9 Drawing Sheets

| | | COUNT VALUE OF COUNTER | | | | | | | | | |
|---|---|---|---|---|---|---|---|---|---|---|---|
| | | 0 | 1 | 2 | 3 | 4 | 5 | 6 | 7 | 8 | 9 |
| COUNT ABSOLUTE VALUE OF UP/DOWN COUNTER | 10 | 1 | 1 | 1 | 1 | 1 | 1 | 1 | 1 | 1 | 1 |
| | 9 | 1 | 1 | 1 | 1 | 1 | 0 | 1 | 1 | 1 | 1 |
| | 8 | 1 | 1 | 1 | 0 | 1 | 1 | 1 | 1 | 0 | 1 |
| | 7 | 1 | 1 | 0 | 1 | 1 | 0 | 1 | 1 | 0 | 1 |
| | 6 | 1 | 0 | 1 | 0 | 1 | 1 | 0 | 1 | 0 | 1 |
| | 5 | 1 | 0 | 1 | 0 | 1 | 0 | 1 | 0 | 1 | 0 |
| | 4 | 0 | 1 | 0 | 1 | 0 | 0 | 1 | 0 | 1 | 0 |
| | 3 | 0 | 0 | 1 | 0 | 0 | 1 | 0 | 0 | 1 | 0 |
| | 2 | 0 | 0 | 0 | 1 | 0 | 0 | 0 | 0 | 1 | 0 |
| | 1 | 0 | 0 | 0 | 0 | 0 | 1 | 0 | 0 | 0 | 0 |
| | 0 | 0 | 0 | 0 | 0 | 0 | 0 | 0 | 0 | 0 | 0 |

CLOCK AND DATA RECOVERY CIRCUIT

BACKGROUND OF THE INVENTION

1. Field of the Invention

The present invention relates to a technique of extracting a clock signal from input data in an LSI at the receiving end in the serial transmission of data between LSIs.

2. Description of Related Art

With the progress of semiconductor technology, data transmission between LSIs is serialized. In order to reduce electromagnetic interface (EMI) in the serial data transmission, there is known a technique of performing frequency modulation using a spread spectrum clock in an LSI at the transmitting end and then extracting a clock from frequency-modulated serial data by a clock and data recovery circuit in an LSI at the receiving end.

FIG. 7 is the illustration shown in FIG. 1 of Japanese Unexamined Patent Application Publication No. 2005-5999, and it shows the clock and data recovery circuit which is disclosed therein. The clock and data recovery circuit includes a phase detector 101, an integrator 102, an integrator 103, a pattern generator 104, a mixer 105, and a phase interpolator 106. The phase detector 101 compares the phase of input serial data with the phase of a synchronous clock signal which is output from the phase interpolator 106 and outputs a comparison result. Based on the comparison result, a frequency tracking loop which is formed by the integrator 103 and the pattern generator 104 tracks the phase shift at low frequencies or the frequency shift, and a phase tracking loop which is formed by the integrator 102 tracks the phase shift at high frequencies which cannot be tracked by the frequency tracking loop. The mixer 105 mixes the results of the frequency tracking loop and the phase tracking loop. Based on the mixture result, the phase of the synchronous clock signal which is output from the phase interpolator 106 is controlled, thereby extracting the clock of the serial data.

The phase detector 101 detects a difference in phase between the serial data and the synchronous clock signal and outputs an up signal UP1 or a down signal DOWN1 which indicates the difference as a comparison result. The integrator 102 and the integrator 103 are up/down counters that smooth the comparison result to obtain UP2/DOWN2 and UP3/DOWN3, respectively, and output them as control signals. The integrator 102 and the integrator 103 respectively have a predetermined count width. The pattern generator 104 generates a control signal UP4/DOWN4 for correcting the frequency of the synchronous clock signal based on the control signal UP3/DOWN3.

The phase detector 101 outputs "1" for the up signal UP1 when the phase of the synchronous clock signal should be advanced. On the other hand, the phase detector 101 outputs "1" for the down signal DOWN1 when the phase of the synchronous clock signal should be delayed.

Because the phase tracking loop tracks the high-frequency phase shift and the frequency tracking loop tracks the frequency shift or the low-frequency phase shift, the count width of the integrator 102 is set to be smaller than the count width of the integrator 103. The integrator 102 and the integrator 103 operate in the same manner except that the count width is different, and thus the integrator 103 only is described hereinafter.

The integrator 103 counts from "−m" to "+m" and the count width is "m+1" (m is an integer). The integrator 103 counts up when UP1 is "1" and counts down then DOWN1 is "1". When the count value is "+m" and UP1 is "1", the integrator 103 outputs "1" for UP3 and performs clear operation which sets the count value back to 0. When the count value is "−m" and DOWN1 is "1", the integrator 103 outputs "1" for DOWN3 and performs clear operation which sets the count value back to 0.

In this manner, the signals UP1 and DOWN1 are smoothed by the integrator 103. As the count width of the integrator 103 is larger, the period of smoothing UP1 and DOWN1 is longer. Thus, the count width of the integrator 103 is a smoothing period.

The signal UP3/DOWN3 which is output from the integrator 103 is input to the pattern generator 104.

FIG. 8 is the illustration shown in FIG. 7 of Japanese Unexamined Patent Application Publication No. 2005-5999, and it shows the configuration of the pattern generator 104. The pattern generator 104 includes a counter 141 that receives a clock signal and repeatedly counts from 0 to a predetermined upper limit in synchronization with the clock, an up/down counter 142 that receives the control signal UP3/DOWN3 from the integrator 103 and the clock signal and counts up or counts down, and a decoder 143 that receives and decodes the count values from the counter 141 and the up/down counter 142 and outputs it as a result of the frequency tracking loop.

The pattern generator 104 outputs "1" for UP4 which indicates that the phase of the clock signal is advanced or outputs "1" for DOWN4 which indicates that the phase of the clock signal is delayed, respectively several times in each period with a predetermined length that is represented by the number of clocks or cycles. The frequency of outputting "1" for UP4 or outputting "1" for DOWN4 in each period is determined by the state of UP3/DOWN3 from the integrator 103. Specifically, if UP3 with "1" is output successively, the frequency of outputting "1" for UP4 increases or the frequency of outputting "1" for DOWN4 decreases. On the other hand, if DOWN3 with "1" is output successively, the frequency of outputting "1" for DOWN4 increases or the frequency of outputting "1" for UP4 decreases.

The length which is represented by the number of cycles is called a pattern length of the pattern generator 104. The pattern length of the pattern generator 104 is determined by the count width of the counter 141. The count width of the up/down counter 142 is generally the same as the count width of the counter 141. For example, if the counter 141 counts from "0" to "k" (k is an integer) and the count width is "k+1", the up/down counter 142 generally counts from "−k" to "+k" and the count width at one side is "k+1". The pattern length of the pattern generator 104 is "k+1". The count width of the up/down counter 142 may be different from the count width of the counter 141.

FIG. 9 is the illustration shown in FIG. 10 of Japanese Unexamined Patent Application Publication No. 2005-5999, and it shows another clock and data recovery circuit which is disclosed therein. The clock and data recovery circuit is different from the clock and data recovery circuit shown in FIG. 7 in that the frequency tracking loop and the phase tracking loop share the integrator 102.

As described in the foregoing, in the frequency tracking loop of the clock and data recovery circuit shown in FIG. 7, as the count width of the integrator 103 is larger, the smoothing period is longer, so that the frequency tracking loop is less sensitive to the phase shift of serial data. This deteriorates the effect of frequency correction of the clock and data recovery circuit and thereby decreases the tolerance to jitter at low frequencies (which is referred to simply as jitter tolerance).

On the other hand, as the count width of the integrator 103 is smaller, the smoothing period is shorter, so that the frequency tracking loop is more sensitive to the phase shift of serial data. The inventor of the present invention has studied and found that overcorrection of a frequency occurs in a particular frequency range to cause a decrease in jitter tolerance. This is possibly because if the count width of the integrator 103 is small, the phase is fed back with a delay with respect to input jitter in the frequency tracking loop.

This is the same for the clock and data recovery circuit shown in FIG. 9.

SUMMARY

According to an embodiment of the present invention, there is provided a clock and data recovery circuit. The clock and data recovery circuit includes a clock generator to generate a synchronous clock signal, a phase detector to compare a phase of the synchronous clock signal obtained by the clock generator with a phase of serial data and obtain a phase error signal corresponding to a comparison result, a phase tracking loop to acquire a phase correction control signal for tracking phase shift of the serial data based on the phase error signal, and a frequency tracking loop to acquire a frequency correction control signal for tracking freq. The clock generator corrects the phase of the synchronous clock signal based on the frequency correction control signal and the phase correction control signal.

In the above clock and data recovery circuit, the frequency tracking loop includes a first smoothing unit to receive the phase error signal obtained by the phase detector as an input signal, smooth the input signal in each smoothing period with a predetermined length and output a smoothed error signal, and a pattern generator to generate a pattern for changing the phase of the synchronous clock signal at a frequency corresponding to the smoothed error signal in each pattern generation period with a predetermined length and output the pattern as the frequency correction control signal. The first smoothing unit changes the length of the smoothing period according to a direction of a change in the frequency of generating the frequency correction control signal.

The implementation of the above clock and data recovery circuit as a method, an apparatus or a system is also effective as an embodiment of the present invention.

The technique of the present invention improves jitter tolerance in a clock and data recovery circuit which extracts a synchronous clock signal from serial data.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a view showing an example of a truth table which is used in a decoder in the pattern generator shown in FIG. 2;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The embodiments of the present invention are described hereinafter with reference to the drawings.

First Embodiment

Figure 1:
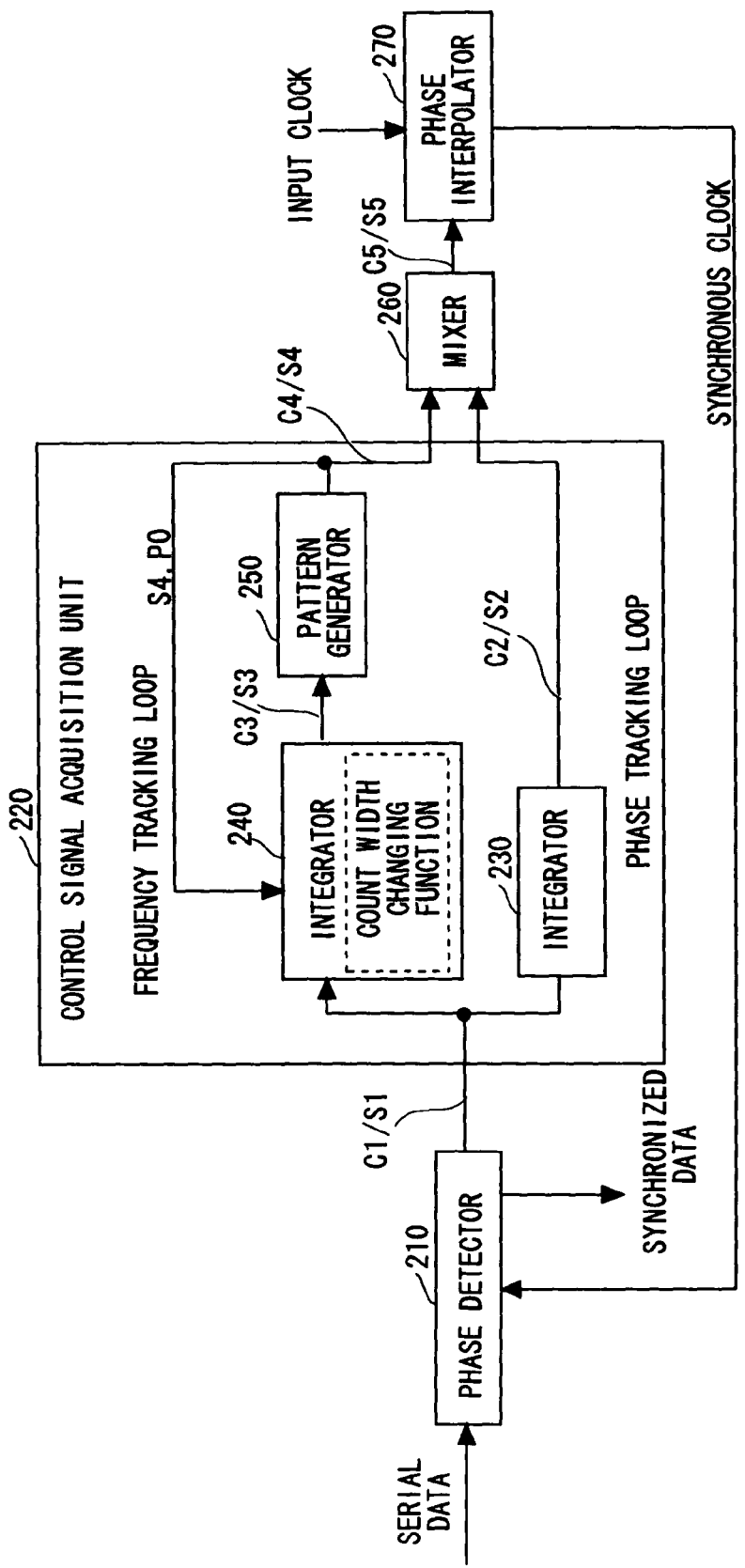
FIG. 1 is a view showing a clock and data recovery circuit according to a first embodiment of the present invention.

FIG. 1 shows a clock and data recovery circuit 200 according to a first embodiment of the present invention. The clock and data recovery circuit 200 is placed in a receiving device of serial data which is frequency-modulated using a spread spectrum clock, and it extracts a synchronous clock signal from received serial data.

The clock and data recovery circuit 200 includes a phase detector 210, a control signal acquisition unit 220, a mixer 260, and a phase interpolator 270.

The phase interpolator 270 obtains a synchronous clock by changing the phase of an input clock and outputs the synchronous clock to the phase detector 210. The phase interpolator 270 thus serves as a clock generator.

The phase detector 210 receives a synchronous clock and serial data. The phase detector 210 compares the phases of the serial data and the synchronous clock, and outputs a carry signal C1 which indicates that the phase of the synchronous clock should be shifted and a sign signal S1 which indicates the direction of phase shifting as a comparison result. Specifically, if the phase of the synchronous clock delays behind the phase of the serial data, the phase detector 210 outputs "1" for C1 and "1" for S1 in order to advance the phase of the synchronous clock. On the other hand, if the phase of the synchronous clock is leading ahead of the phase of the serial data, the phase detector 210 outputs "1" for C1 and "0" for S1 in order to delay the phase of the synchronous clock. If it cannot be determined whether the phase of the synchronous clock is ahead of or behind the phase of the serial data, the phase detector 210 outputs "0" for C1 and an arbitrary value for S1 in order not to shift the phase of the synchronous clock. The phase detector 210 further has the function of outputting synchronized data, which is the serial data synchronized by the synchronous clock, to a serial-to-parallel converter (not shown).

The control signal acquisition unit 220 acquires a phase correction control signal for tracking the phase shift of serial data and a frequency correction control signal for tracking the frequency shift of a serial data signal based on C1/S1 which is output as a comparison result from the phase detector 210. As shown in FIG. 1, the control signal acquisition unit 220 includes an integrator 240, a pattern generator 250 and an integrator 230. The integrator 230 forms a phase tracking loop and serves as a phase correction control signal acquisition unit that acquires a phase correction control signal. The integrator 240 and the pattern generator 250 form a frequency tracking loop and serve as a frequency correction control signal acquisition unit that acquires a frequency correction control signal. The integrator 240 corresponds to the "first smoothing unit" or the "first integrator" referred to in claims.

The mixer 260 mixes the phase correction control signal C2/S2 from the integrator 230 and a frequency correction control signal C4/S4 from the pattern generator 250 to obtain a mixed signal C5/S5 and outputs it to the phase interpolator 270 as a signal for controlling the phase interpolator 270.

The phase interpolator 270 changes the phase of an input clock according to the mixed signal C5/S5. The phase and frequency of the synchronous clock thereby track the phase and frequency of the serial data, so that the synchronous clock is a clock which is extracted from the serial data.

The control signal acquisition unit 220 is described hereinafter in detail. The phase tracking loop is described firstly.

The integrator 230 obtains the phase correction control signal C2/S2 by performing integration of C1/S1. Because the value of the signal C1/S1 changes frequently, if the signal C1/S1 is used as it is for the control of the phase interpolator 270 as a phase correction control signal, the phase of the synchronous clock changes frequently. In light of this, the integrator 230 functions as a low-pass filter which smoothes the signal C1/S1 and it prevents the frequent change in the phase of the synchronous clock which is output from the phase interpolator 270. The integrator 230 is formed by an up/down counter, for example. It is necessary to use the integrator 230 with a small count width in order to track the phase shift at high frequencies. As an example, the integrator 230 counts from "−5" to "+5" and has the count width of 6.

Specifically, the integrator 230 counts up when C1=1 and S1=1, and counts down when C1=1 and S1=0. When the count value is "+5" and C1=1 and S1=1, the integrator 230 outputs "1" for C2 and "1" for S2 and performs clear operation which sets the count value back to 0. On the other hand, when the count value is "−5" and C1=1 and S1=0, the integrator 103 outputs "1" for C2 and "0" for S2 and performs clear operation which sets the count value back to 0. In other cases, the integrator 103 outputs "0" for C2, and "1" for S2 when the sign of the count value is positive and "0" for S2 when it is negative.

The integrator 230 outputs the phase correction control signal C2/S2 to the mixer 260.

The frequency tracking loop is described next.

The integrator 240 smoothes C1/S1 by performing integration and thereby obtains C3/S3. The integrator 240 is also formed by an up/down counter.

The integrator 240 has a count width changing function and changes its count width. Apart form this point, the count-up operation, the count-down operation and the clear operation of the integrator 240 are the same as those of the integrator 230. The count width and the count width changing function of the integrator 240 are described later.

The pattern generator 250 generates a pattern C4/S4 for changing the phase of the synchronous clock signal at the frequency corresponding to C3/S3 which is output from the integrator 240 in each pattern generation period with a predetermined length and outputs it as a frequency correction control signal. The pattern generator 250 further generates a signal PO which indicates the state where the frequency correction control signal is not generated and feeds back the signal PO and S4 to the integrator 240.

Figure 2:
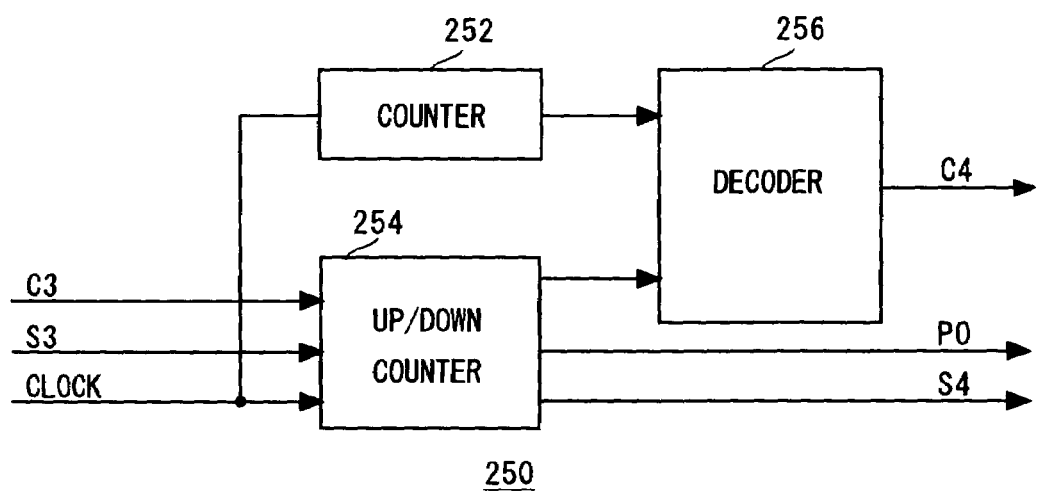
FIG. 2 is a view showing a pattern generator in the clock and data recovery circuit shown in FIG. 1.

FIG. 2 shows the configuration of the pattern generator 250. The pattern generator 250 includes a counter 252, an up/down counter 254 and a decoder 256. In this embodiment, the pattern length of the pattern generator 250 is 10, for example. The pattern length is the length of the pattern generation period of the pattern generator 250.

The counter 252 repeatedly counts from "0" to "9" corresponding to the pattern length and the count width is 10. The up/down counter 254 also repeatedly counts from "−10" to "+10" corresponding to the pattern length and the count width is 11.

The counter 252 repeatedly counts from "0" to "9" in synchronization with the clock and outputs the count value to the decoder 256.

The up/down counter 254 counts up when C3=1 and S3=1 and counts down when C3=1 and S3=0 in the range of "−10" to "+10" according to input C3/S3. When the count value is "+10" and C3=1 and S3=1, the count value is kept to "+10". On the other hand, when the count value is "−10" and C3=1 and S3=0, the count value is kept to "−10". Further, the up/down counter 254 outputs PO, which is PO=1 when the count value is 0 and PO=0 when the count value is other than 0, to the integrator 240. The up/down counter 254 further outputs S4 which indicates the sign of the count value to the integrator 240 and the mixer 260 and outputs a count absolute value to the decoder 256.

Based on the count values of the counter 252 and the up/down counter 254, the decoder 256 outputs C4 at the frequency which is in proportion to a difference in frequency between the serial data and the input clock in 10 clocks which correspond to the pattern length.

FIG. 3 is a truth table to describe specific processing of the decoder 256. FIG. 3 shows an example of the output C4 of the decoder 256 for the input count value of the counter 252 and the input count absolute value of the up/down counter 254. In FIG. 3, "1" indicates C4=1, and "0" indicates C4=0. The size of the truth table is 10×11, which is the product of the count width of the counter 252 and the count width of the up/down counter 254.

As shown in FIG. 3, the decoder 256 operates as follows:
1. When the count value of the up/down counter 254 is "0", the decoder 256 outputs "0" for C4;
2. When the count absolute value of the up/down counter 254 is "k" (k is an integer of 1 or above), the decoder 256 outputs "1" k number of times in 10 clocks which correspond to the pattern length.

Thus, as the absolute value of the count value of the up/down counter 254 is larger, the frequency of generating C4 in one pattern generation period is higher.

Further, as shown in FIG. 3, C4 at the value "1" is generated at substantially equal intervals in each pattern generation period. For example, if the count absolute value of the up/down counter 254 is "1", C4=1 is generated when the count value of the counter 252 is "5", and the interval of generation is 10. If the count absolute value of the up/down counter 254 is "2", C4=1 is generated when the count value of the counter 252 is "3" and "8", and the interval of generation is 5. If the count absolute value of the up/down counter 254 is "3", C4=1 is generated when the count value of the counter 252 is "2", "5" and "8", and the interval of generation is 3 or 4.

In this manner, C4 is output from the decoder 256 at substantially equal intervals.

In this embodiment, the pattern signal C4/S4 which is generated by the pattern generator 250 is output to the mixer 260, and S4/PO is fed back to the integrator 240.

The integrator 240 has the function of changing its count value with the use of S4/PO which is fed back from the pattern generator 250. The function is implemented based on the direction of a change in the frequency of generating C4 in the pattern generation period.

When any of the following two conditions is met, it is determined that the frequency of generating C4 is on the increase:
1. S3 which is generated in the integrator 240 and S4 which is fed back are the same;
2. PO which is fed back is "1".

When none of the above two conditions are met, it is determined that the frequency of generating C4 is on the decrease.

The integrator 240 changes the count width to be smaller when the frequency of generation is on the decrease than when it is on the increase.

In this embodiment, a maximum count width of the integrator 240 is 64, for example. The integrator 240 sets the count width of the integrator 240 to the maximum value, i.e. 64, when the frequency of generation is on the increase, and sets the count width to a value smaller than 64, e.g. 32, when the frequency of generation is on the decrease. In the description below, the count width of the integrator 240 when the frequency of generation is on the increase is represented by "nu", and the count width of the integrator 240 when the frequency of generation is on the decrease is represented by "nd".

Figure 4:
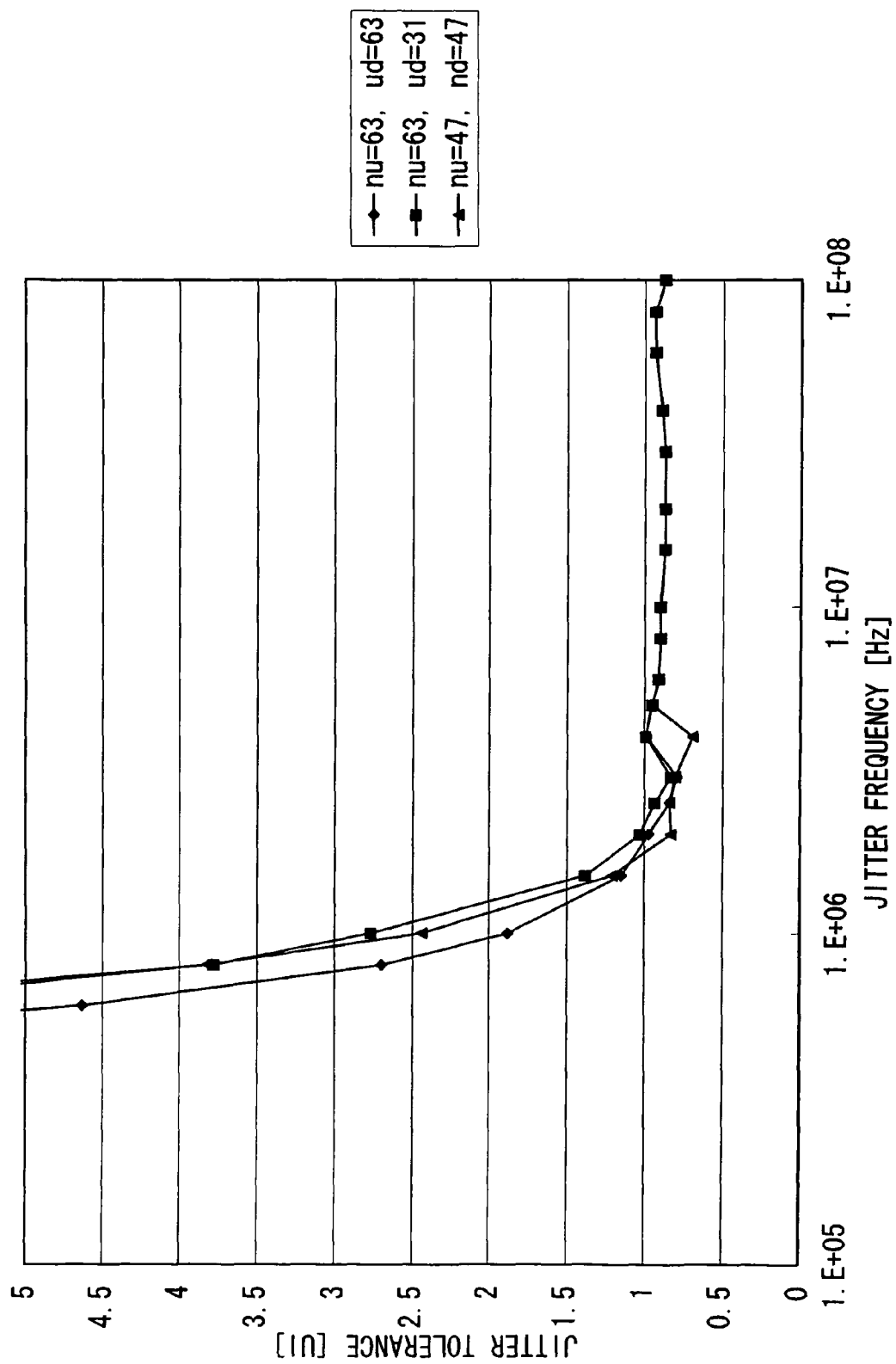
FIG. 4 is a view showing the effect of improving jitter tolerance by the clock and data recovery circuit shown in FIG. 1.

FIG. 4 is a view to compare the jitter tolerance of the clock and data recovery circuit 200 in this embodiment and the jitter tolerance of a clock and data recovery circuit where the count width of the integrator 240 is fixed.

As shown in FIG. 4, if "nu=64 and nd=32" as in this embodiment, the jitter tolerance for the frequency of 1.5 MHz or lower improves compared with the case where the count width of the integrator 240 is fixed to 64 (nu=nd=64), and the jitter tolerance for the frequency of 1 to 4 MHz improves compared with the case where the count width of the integrator 240 is fixed to 48 (nu=nd=48).

As described above, the clock and data recovery circuit 200 in this embodiment can avoid the overcorrection of a frequency while maintaining the correction effect of the frequency tracking loop. The jitter tolerance of the circuit as a whole thereby improves.

Second Embodiment

Figure 5:
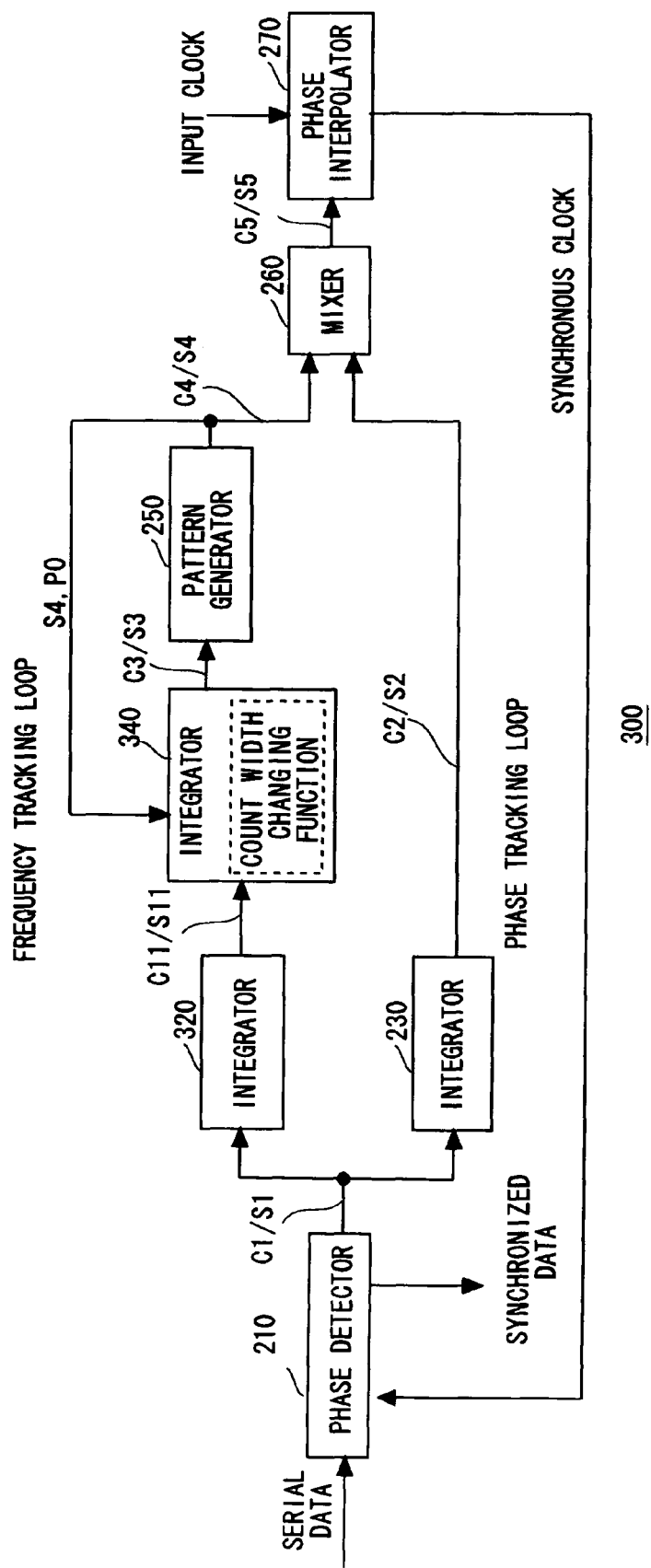
FIG. 5 is a view showing a clock and data recovery circuit according to a second embodiment of the present invention.

FIG. 5 shows a clock and data recovery circuit 300 according to a second embodiment of the present invention. The functional blocks of the clock and data recovery circuit 300 are the same as those of the clock and data recovery circuit 200 shown in FIG. 1 except that an integrator 320 and an integrator 340 substitute for the integrator 240 in the clock and data recovery circuit 200. In FIG. 5, the same elements as in the clock and data recovery circuit 200 shown in FIG. 1 are denoted by the same reference symbols and not described herein.

In the clock and data recovery circuit 300, the integrator 320, the integrator 340 and the pattern generator 250 form a frequency tracking loop. The integrator 340 corresponds to the "first integrator" referred to in claims, and the integrator 320 corresponds to the "second integrator" referred to in claims.

The integrator 320 may have the same configuration as the integrator 230, and it counts from "−5" to "+5" and the count width is 6, for example. Like the integrator 230, the integrator 320 smoothes the signal C1/S1 by performing integration and thereby obtains a signal C11/S11. The signal C11/S11 is the same as the phase correction control signal C2/S2 which is obtained by the integrator 230.

The integrator 340 further smoothes the signal C11/S11 which is obtained by the integrator 320 and thereby obtains a signal C3/S3. The configuration and the operation of the integrator 340 are the same as those of the integrator 240 in the clock and data recovery circuit 200 of FIG. 1 except that a maximum count width is smaller than that of the integrator 240.

The clock and data recovery circuit 300 has the same advantage as the clock and data recovery circuit 200 shown in FIG. 1. If the integrator 340 counts from "−11" to "+11" and the count width is 12, the clock and data recovery circuit 300 shown in FIG. 5 and the clock and data recovery circuit 200 shown in FIG. 1 have the same performance.

Figure 6:
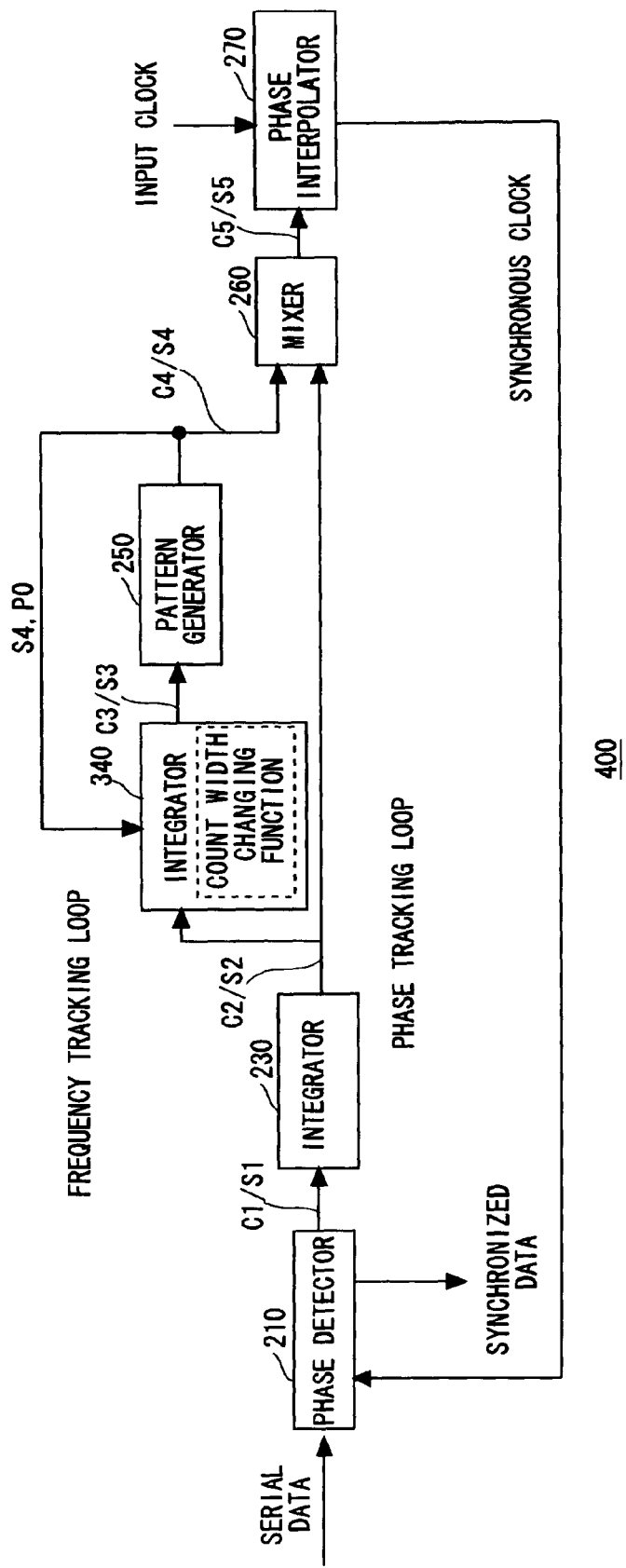
FIG. 6 is a view showing a clock and data recovery circuit according to a third embodiment of the present invention.
Figure 7:
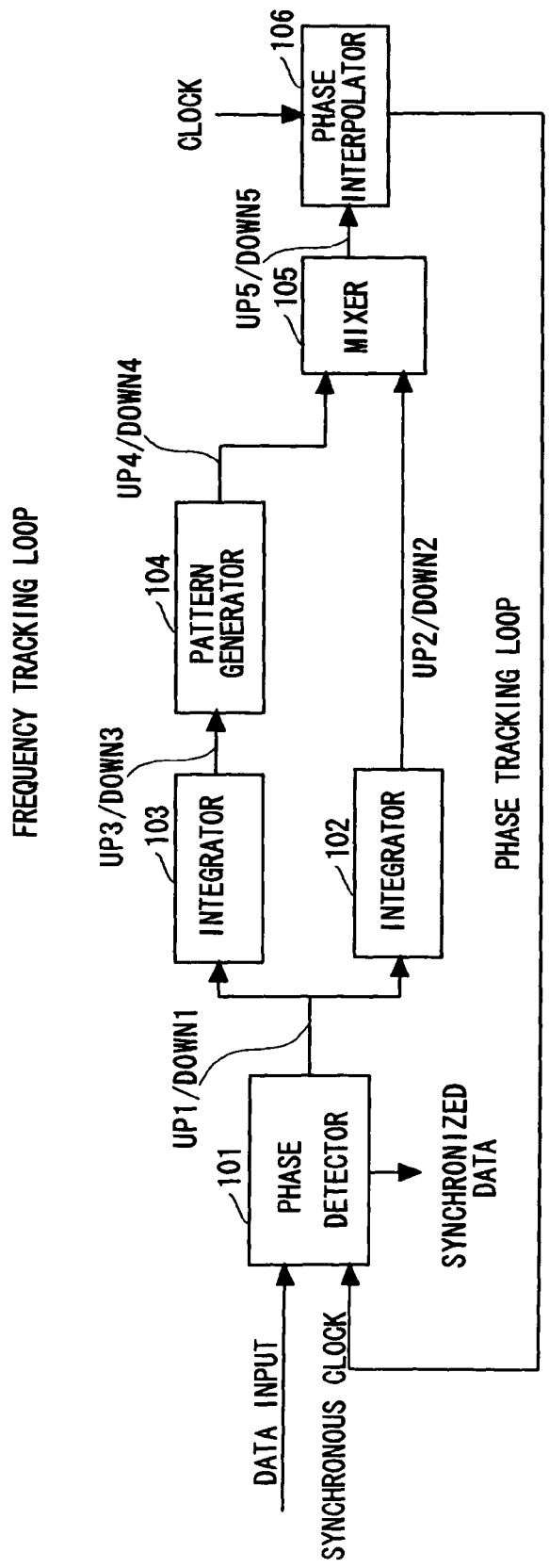
FIG. 7 is a view showing a clock and data recovery circuit according to a related art.
Figure 8:
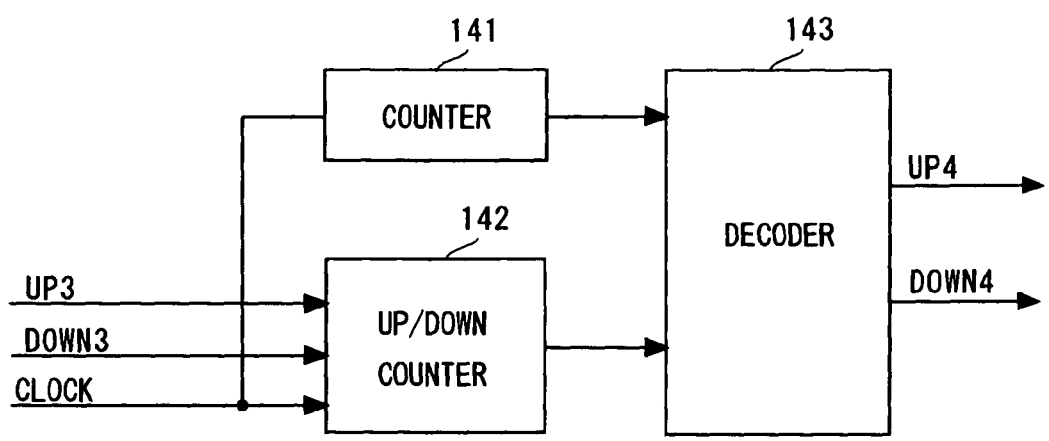
FIG. 8 is a view showing a pattern generator in the clock and data recovery circuit shown in FIG. 7.
Figure 9:
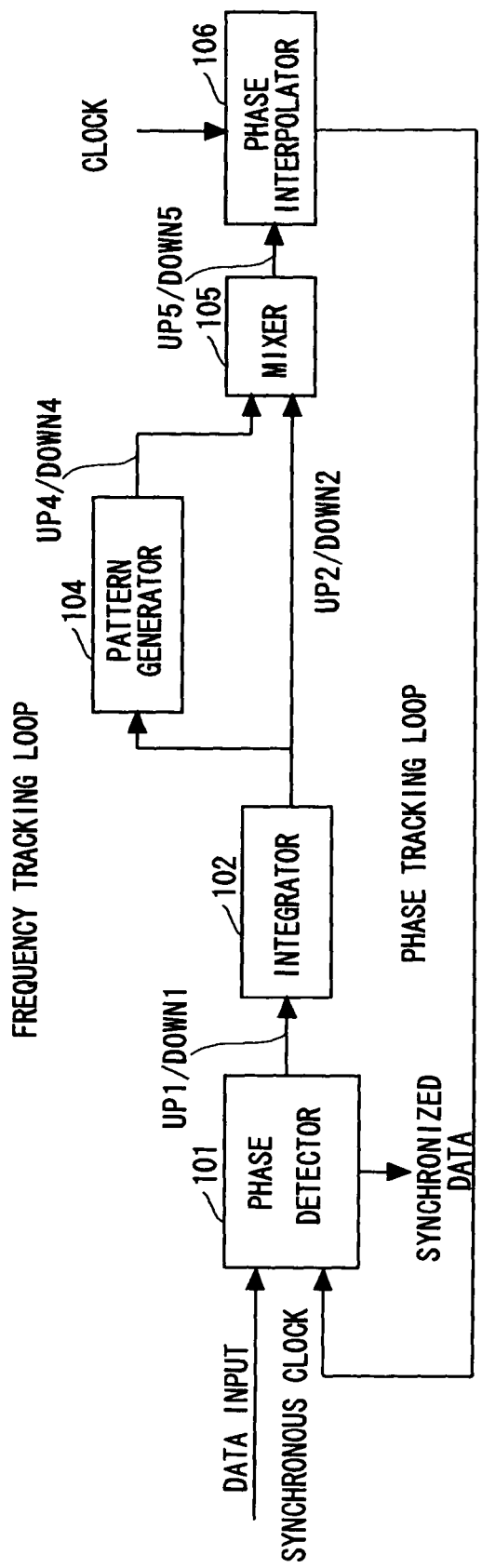
FIG. 9 is another view showing a clock and data recovery circuit according to the related art.

FIG. 6 shows a clock and data recovery circuit 400 according to a third embodiment of the present invention. The clock and data recovery circuit 400 is the same as the clock and data recovery circuit 300 shown in FIG. 5 except that the integrator 320 in the clock and data recovery circuit 300 is eliminated and the phase tracking loop and the frequency tracking loop share the integrator 230. In the clock and data recovery circuit 400, the integrator 340 corresponds to the "first integrator" referred to in claims, and the integrator 320 corresponds to the "second integrator" referred to in claims.

The clock and data recovery circuit 400 has the same advantage as the clock and data recovery circuit 200 shown in FIG. 1 and the clock and data recovery circuit 300 shown in FIG. 5.

Although the embodiments of the present invention are described in the foregoing, the present invention is not restricted to the above-described embodiments, and various changes and modifications may be made without departing from the scope of the invention. All such changes and modifications as would be obvious to one skilled in the art are intended for inclusion within the scope of the present invention.

For example, although a combination of C1=1 indicating the need for changing the phase of a clock and S1 indicating the direction of changing the phase is used as a phase error signal which is output from the phase detector 210 in the embodiments described above, it is not limited to such a combination. For example, a combination of UP1=1 indicating the need for advancing the phase of a synchronous clock and DOWN1=1 indicating the need for delaying the phase of a synchronous clock may be used as described in the related art. In this case, UP1 corresponds to the logical AND of "C1" and "S1" used in the above-described embodiments, and DOWN1 corresponds to the logical AND of "C1" and "the inversion of S1". Further, a combination of DOWN1=1 indicating that the phase of a synchronous signal delays and UP1=1 indicating that the phase of a synchronous signal is leading may be used as the phase error signal. In addition to the above-described signal which indicates the delayed or leading state of the phase of a clock, a signal which indicates whether an integrator in the subsequent stage should count up or count down (e.g. the logical AND of C1 and S1) may be used.

It is apparent that the present invention is not limited to the above embodiments, but may be modified and changed without departing from the scope and spirit of the invention.

What is claimed is:

1. A clock and data recovery circuit comprising:
   a clock generator to generate a synchronous clock signal;
   a phase detector to compare a phase of the synchronous clock signal obtained by the clock generator with a phase of serial data and obtain a phase error signal corresponding to a comparison result of the comparing;
   a phase tracking loop to acquire a phase correction control signal for tracking phase shift of the serial data based on the phase error signal; and a frequency tracking loop to acquire a frequency correction control signal for tracking frequency shift of the serial data based on the phase error signal, wherein the clock generator corrects the phase of the synchronous clock signal based on the frequency correction control signal and the phase correction control signal, the frequency tracking loop includes:
- a first smoothing unit to receive the phase error signal obtained by the phase detector as an input signal, smooth the input signal in each smoothing period with a predetermined length and output a smoothed error signal; and
- a pattern generator to generate a pattern for changing the phase of the synchronous clock signal at a frequency corresponding to the smoothed error signal in each pattern generation period with a second predetermined length and output the pattern as the frequency correction control signal, and the first smoothing unit changes the length of the smoothing period according to a direction of a change in the frequency of the frequency correction control signal.

2. The clock and data recovery circuit according to claim 1, wherein
the pattern generator generates the pattern at substantially equal intervals in each pattern generation period.

3. The clock and data recovery circuit according to claim 2, wherein
the first smoothing unit sets the length of the smoothing period to be shorter when the frequency of the frequency correction control signal is decreasing than when the frequency is increasing.

4. The clock and data recovery circuit according to claim 3, wherein
the frequency tracking loop further includes a second smoothing unit connected between the phase detector and the first smoothing unit, to smooth the phase error signal obtained by the phase detector, and
the first smoothing unit receives the phase error signal smoothed by the second smoothing unit as an input signal.

5. The clock and data recovery circuit according to claim 4, wherein
the phase tracking loop acquires the phase error signal smoothed by the second smoothing unit as the phase correction control signal.

6. The clock and data recovery circuit according to claim 2, wherein
the frequency tracking loop further includes a second smoothing unit connected between the phase detector and the first smoothing unit, to smooth the phase error signal obtained by the phase detector, and
the first smoothing unit receives the phase error signal smoothed by the second smoothing unit as an input signal.

7. The clock and data recovery circuit according to claim 6, wherein
the phase tracking loop acquires the phase error signal smoothed by the second smoothing unit as the phase correction control signal.

8. The clock and data recovery circuit according to claim 1, wherein
the first smoothing unit sets the length of the smoothing period to be shorter when the frequency of the frequency correction control signal is decreasing than when the frequency is increasing.

9. The clock and data recovery circuit according to claim 8, wherein
the frequency tracking loop further includes a second smoothing unit connected between the phase detector and the first smoothing unit, to smooth the phase error signal obtained by the phase detector, and
the first smoothing unit receives the phase error signal smoothed by the second smoothing unit as an input signal.

10. The clock and data recovery circuit according to claim 9, wherein
the phase tracking loop acquires the phase error signal smoothed by the second smoothing unit as the phase correction control signal.

11. The clock and data recovery circuit according to claim 1, wherein
the first smoothing unit comprises a first integrator, and
the pattern generator has a pattern length corresponding to the pattern generation period with the second predetermined length, counts an integral of the first integrator, and generates the frequency correction control signal based on a count result.

12. The clock and data recovery circuit according to claim 11, wherein
the input signal of the first integrator includes a carry signal indicating a need for shifting the phase of the synchronous clock signal and a sign signal indicating a direction of shifting the phase of the synchronous clock signal.

13. The clock and data recovery circuit according to claim 12, wherein
the first integrator comprises an up/down counter to count up or count down according to the input signal, and
the first integrator sets a count width to be smaller when the frequency of the frequency correction control signal is decreasing than when the frequency is increasing.

14. The clock and data recovery circuit according to claim 11, wherein
the input signal of the first integrator includes an up signal indicating that the phase of the synchronous clock signal is leading and a down signal indicating that the phase of the synchronous clock signal delays.

15. The clock and data recovery circuit according to claim 14, wherein
the first integrator comprises an up/down counter to count up or count down according to the input signal, and
the first integrator sets a count width to be smaller when the frequency of the frequency correction control signal is decreasing than when the frequency is increasing.

16. The clock and data recovery circuit according to claim 11, wherein
the frequency tracking loop further includes a second smoothing unit connected between the phase detector and the first smoothing unit, to smooth the phase error signal obtained by the phase detector, and
the first smoothing unit receives the phase error signal smoothed by the second smoothing unit as an input signal.

17. The clock and data recovery circuit according to claim 16, wherein
the phase tracking loop acquires the phase error signal smoothed by the second smoothing unit as the phase correction control signal.

18. The clock and data recovery circuit according to claim 1, wherein
the frequency tracking loop further includes a second smoothing unit connected between the phase detector and the first smoothing unit, to smooth the phase error signal obtained by the phase detector, and the first smoothing unit receives the phase error signal smoothed by the second smoothing unit as an input signal.

19. The clock and data recovery circuit according to claim 18, wherein the phase tracking loop acquires the phase error signal smoothed by the second smoothing unit as the phase correction control signal.

* * * * *